(12) United States Patent
Masuoka

(10) Patent No.: US 6,413,811 B1
(45) Date of Patent: Jul. 2, 2002

(54) METHOD OF FORMING A SHARED CONTACT IN A SEMICONDUCTOR DEVICE INCLUDING MOSFETS

(75) Inventor: Sadaaki Masuoka, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/609,926

(22) Filed: Jul. 5, 2000

(30) Foreign Application Priority Data

Jul. 5, 1999 (JP) .......................................... 11-190714

(51) Int. Cl.⁷ ................... H01L 21/8249; H01L 21/336; H01L 21/3205; H01L 21/4763
(52) U.S. Cl. ....................... 438/233; 438/199; 438/229; 438/299; 438/305; 438/586; 438/597
(58) Field of Search ................. 438/197, 199, 438/213, 275, 276, 277, 279, 618, 233, 229, 230, 231, 232, 299, 301, 303, 305, 586, 655, 597

(56) References Cited

U.S. PATENT DOCUMENTS 6,060,346 A * 5/2000 Roh et al. ................... 438/200
6,081,016 A * 6/2000 Tanaka et al. ............... 257/377
6,121,080 A * 9/2000 Wu et al. ..................... 438/238

FOREIGN PATENT DOCUMENTS

| JP | 05-251665 | 9/1993 |
| JP | 8-125035 | 5/1996 |
| JP | 8-340052 | 12/1996 |
| JP | 10-173073 | 6/1998 |
| JP | 10-242299 | 9/1998 |
| JP | 10-321734 | 12/1998 |
| JP | 11-17028 | 1/1999 |
| JP | 11-345887 | 12/1999 |

* cited by examiner

Primary Examiner—Tuan H. Nguyen
Assistant Examiner—T. Pham
(74) Attorney, Agent, or Firm—Sughrue Mion, PLLC

(57) ABSTRACT

An objective of this invention is to provide a process for manufacturing a shared contact without protrusion toward an adjacent gate electrode and an improved shared contact. This invention allows a shared contact without protrusion from the gate electrode to be prepared by removing a gate electrode which is in contact with a dopant diffusion layer but is not used as a transistor element and forming a shared contact in the area. As a result, a cell size is larger in an SRAM according to this invention than in that according to the prior art.

4 Claims, 6 Drawing Sheets

METHOD OF FORMING A SHARED CONTACT IN A SEMICONDUCTOR DEVICE INCLUDING MOSFETS

BACKGROUND OF THE INVENTION

1. Field of the Invention

This invention relates to a shared contact used in a semiconductor device and a manufacturing process therefor.

2. Description of the Prior Art

An SRAM (Static Random Access Memory) is widely used as a cache memory for a computer or a system memory for a terminal. The SRAM is composed of a flip-flop circuit where each cell stores one bit. The SRAM requires at least four transistors, so that it has been integrated at a quarter of a pace for a DRAM (Dynamic Random Access Memory).

FIG. 5 shows a plan view of a conventional loadless type of SRAM, and FIG. 6 shows its equivalent circuit. FIGS. 5 and 6 are based on K. Noda et al., A 1.9-$\mu m^2$ Loadless CMOS Four-Transistor SRAM Cell in a 0.18-$\mu m$ Logic Technology, IEDM98, pp.643–646, 1998.

There will be described the equivalent circuit of FIG. 6. The four-transistor type of loadless SRAM cell consists of two access transistors constituted by a p-type MOSFET (101, 102) and two driver transistors constituted by an n-type MOSFET (103, 104). Each gate (105, 108) in the access transistors (101, 102) is connected to a word line (117), while each source (106, 110) in the access transistor (101, 102) is connected to a bit line (118, 119). Sources (113, 116) in the driver transistors (103, 104) are grounded, while a gate (111, 114) in one driver transistor (103, 104) is connected to a drain (115, 112) in the other driver transistor. For connection of the access transistor to the driver transistor, the drain (107) in the access transistor (101) is connected to the drain (112) in the driver transistor (103) and the gate (114) in the driver transistor (104) at the point 120, while the drain (109) in the access transistor (102) is connected to the drain (115) in the driver transistor (104) and the gate (111) in the driver transistor (103) at the point 121.

The connection points 120 and 121 in FIG. 6 are of a unique connection style employed in an SRAM. A shared contact is used to utilize them as a device element on a substrate.

There will be described a plan view in FIG. 5 for a conventional loadless type of SRAM cell prepared in accordance with the prior art. In the figure, 201 is an access transistor constituted by a p-type MOSFET which consists of a gate electrode (205), a source region (206) and a drain region (207), and 202 is also an access transistor constituted by a p-type MOSFET which consists of a gate electrode (205), a source region (210) and a drain region (209). The gate electrode (205) in the access transistor (201, 202) is a word line. Next, 203 is a driver transistor constituted by an n-type MOSFET which consists of a gate electrode (211), a source region (213) and a drain region (212), and 204 is also a driver transistor consisting of a gate electrode (214), a source region (216) and a drain region (215).

The drain region (207) in the access transistor (201) is connected to the gate electrode (214) in the driver transistor (204) via a shared contact (228) which corresponds to connection of 109 with 111 at 121 in FIG. 6, and to the drain region (212) in the driver transistor (203) via a shared contact (225) which corresponds to connection of 115 with 111 at 121 in FIG. 6.

The drain region (209) in the access transistor (202) is connected to the gate electrode (211) in the driver transistor (203) via a shared contact (227) which corresponds to connection of 107 with 114 at 120 in FIG. 6, and to the drain region (215) in the driver transistor (204) via a shared contact (226) which corresponds to connection of 112 with 114 at 120 in FIG. 6.

Furthermore, a contact is, but not shown, formed on the source region (206, 210) in the access transistor (201, 202) and connected to a bit line formed on an upper layer, while a contact is, but also not shown, formed on the source region (213, 216) in the driver transistor (203, 204) and connected to a grounding line formed on an upper layer.

The cell in FIG. 5 is surrounded by other cells. In FIG. 5, cells are vertically aligned, in which devices are disposed as a mirror image. Horizontally, there are also aligned cells in which devices are disposed as a mirror image. For example, the source region (216) in the driver transistor (204) is shared with the left adjacent cell as its source region. It is also true for the right adjacent cell.

As described above, SRAM cells are aligned such that a common source region is shared by their driver transistors.

An illustrative process for manufacturing an SRAM cell according to the prior art will be described with reference to cross sections (FIGS. 7(a) to (c)) taken on the line X-X' in the plan view of FIG. 5.

As shown in FIG. 7(a), on a silicon substrate are formed a isolation region (not shown) and a p-type well region (not shown) by a known process, and then a gate oxide film (301) and gate electrodes (302, 303). The p-type well region can be formed, for example, by implanting $B^+$ at an ion-implantation energy of 300 keV, a dose of $2\times10^{13}$ atoms/cm$^2$ and an implantation angle of 0°, then at an ion-implantation energy of 150 keV, a dose of $4\times10^{12}$ atoms/cm$^2$ and an implantation angle of 0° and finally at an ion-implantation energy of 30 keV, a dose of $8\times10^{12}$ atoms/cm$^2$ and an implantation angle of 0°.

A gate oxide film (301) is formed to about 4 nm, for example, by thermal oxidation; for example, a polycrystal silicon film with a thickness of about 160 nm is deposited on the whole surface of a substrate. Then, it is subject to photolithography and dry etching to provide a gate electrode with a desired shape. Then, an. n-type dopant (304), e.g., $As^+$, is implanted, for example, at an ion-implantation energy of 10 keV, a dose of $1\times10^{14}$ atoms/cm$^2$ and an implantation angle of 0° to form an n-type LDD region (305).

Then, as shown in FIG. 7(b), side walls (306, 307) consisting of a silicon oxide film are formed to a width of 100 nm. They can be readily formed, for example, by depositing a silicon oxide film on the whole surface of a substrate to a thickness of about 120 nm by LPCVD and then etching back the whole surface of the substrate by RIE (Reactive Ion Etching). Then, an n-type dopant (308), e.g., $As^+$, is implanted, for example, at an ion-implantation energy of 45 kev, a dose of $5\times10^{15}$ atoms/cm$^2$ and an implantation angle of 0° to form an n$^+$type source-drain region (309). Then, silicide layers (310, 311) are formed on the gate electrodes (302, 303) and the source-drain region (309) by a known procedure.

Then, as shown in FIG. 7(c), an interlayer insulating film (312) made of a silicon nitride film, a silicon oxide film or the like is formed, and the area to be a shared contact is removed by etching and then filled with, e.g., tungsten by a known procedure to form a shared contact (313).

An SRAM cell according to the conventional technique (FIGS. 7(a) to 7(c)), however, has the following drawbacks.

a) The shared contact for the conventional SRAM cell is extended over the side wall (306) like a bridge to be connected with the gate electrode (302) and the source-drain region (309), and consequently protrude toward the adjacent gate electrode (303).

b) The contact area of the shared contact cannot be reduced for further ensuring an adequate conductivity.

In conclusion, according to the process of the prior art, it is required to form the shared contact protruding from the gate electrode (302) toward the adjacent gate electrode (303) to about 180 nm which is the sum of the width, 100 nm, of the side wall (306) and the contact width, 80 nm, of the contact electrode with the source-drain region.

Since the adjacent gate electrode (303) has a side wall (307) with a width of 100 nm, a distance between gate electrodes must be 280 nm in total. The distance between gate electrodes cannot be, therefore, reduced to less than the dimension, 280 nm, and thus the cell size cannot be reduced.

SUMMARY OF THE INVENTION

In the light of the above problems, an objective of this invention is to provide a process for manufacturing a shared contact without protrusion toward an adjacent gate electrode and an improved shared contact.

This invention provides a process for manufacturing a shared contact in a semiconductor device with a flip-flop circuit or a semiconductor device where a gate electrode in one MOSFET is electrically connected to a source or drain region in another MOSFET, essentially consisting of the steps of:

1) forming a gate electrode in a desired shape on a semiconductor substrate surface;
2) depositing an insulating material on the whole surface of the semiconductor substrate and etching it back to form a side wall made of the insulating material on the side of the gate electrode;
3) etching the substrate using a resist having an opening to a predetermined area of the gate electrode surface as a mask to remove the gate electrode in the predetermined area for exposing the substrate surface;
4) removing the resist and ion-implanting a dopant whose conduction type is different from that in the semiconductor substrate, to the exposed semiconductor substrate in the area where the gate electrode has been removed and to the source-drain region;
5) depositing an interlayer insulating film on the whole surface of the substrate and removing the interlayer insulating film in the area where the gate electrode has been removed to form a contact hole; and
6) filling a conductive material in the contact hole.

This invention also provides a shared contact used in a semiconductor device with a flip-flop circuit or a semiconductor device where a gate electrode in one MOSFET is electrically connected to a source or drain region in another MOSFET, characterized in that the bottom surface of the shared contact is in contact with a dopant diffusion layer formed on the surface of the semiconductor surface , the side surfaces of the shared contact are in contact with cross sections of the gate electrode , and the substrate surface is electrically connected with the cross section of the gate electrode.

DETAILED DESCRIPTION OF PREFERRED EMBODIMENTS

In the prior art, a cell size cannot be reduced due to a bridge-shaped shared contact protruding toward an adjacent gate electrode. In the process of this invention, a gate electrode which is in contact with a dopant diffusion layer but is not used as a transistor element (herein, referred to as a "gate electrode in a predetermined area") is removed and a shared contact is formed in the area. In particular, the gate electrode in a predetermined area is etched until the surface of the semiconductor device is exposed to form a contact hole. Then, a dopant is implanted to the substrate surface of the contact hole to connect it with the adjacent source-drain region. Then, the contact hole is filled with a conductive material to provide a shared contact.

As described above, we have investigated a process for manufacturing a shared contact and have finally achieved a shared contact without protrusion from a gate electrode. Applying the shared contact to an SRAM allows the distance between gate electrodes to be reduced and thus the SRAM cell size to be reduced.

In the above step (5), it is desirable to add a misalignment margin in a photolithography process to the contact-hole lengths in a gate width direction and/or a gate length direction during forming the contact hole.

Figure 1:
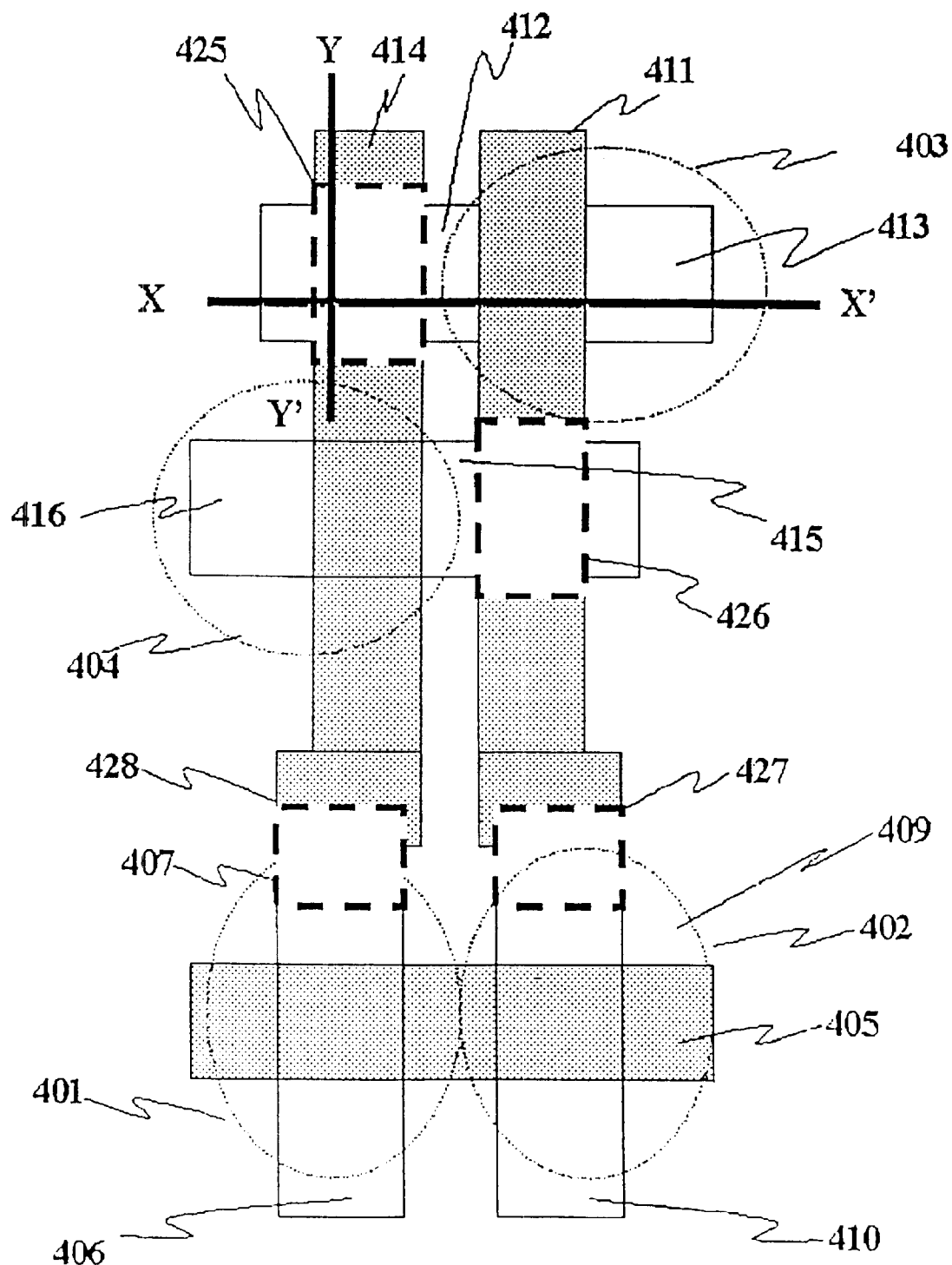
FIG. 1 is a plan view of a semiconductor device according to the process of this invention.
Figure 3:
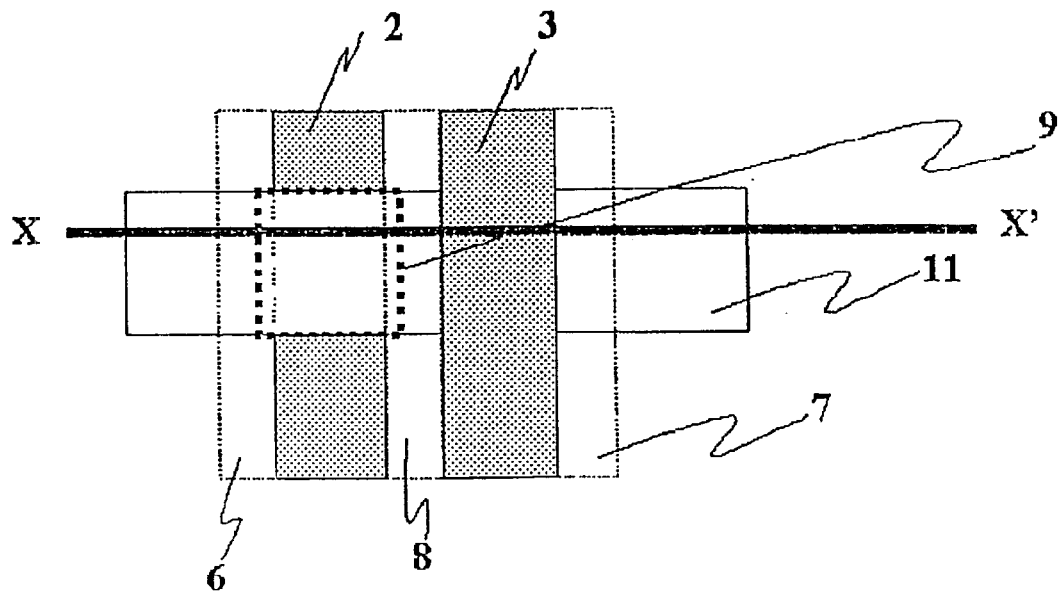
FIG. 3 is a plan view illustrating an embodiment of this invention.
Figure 4:
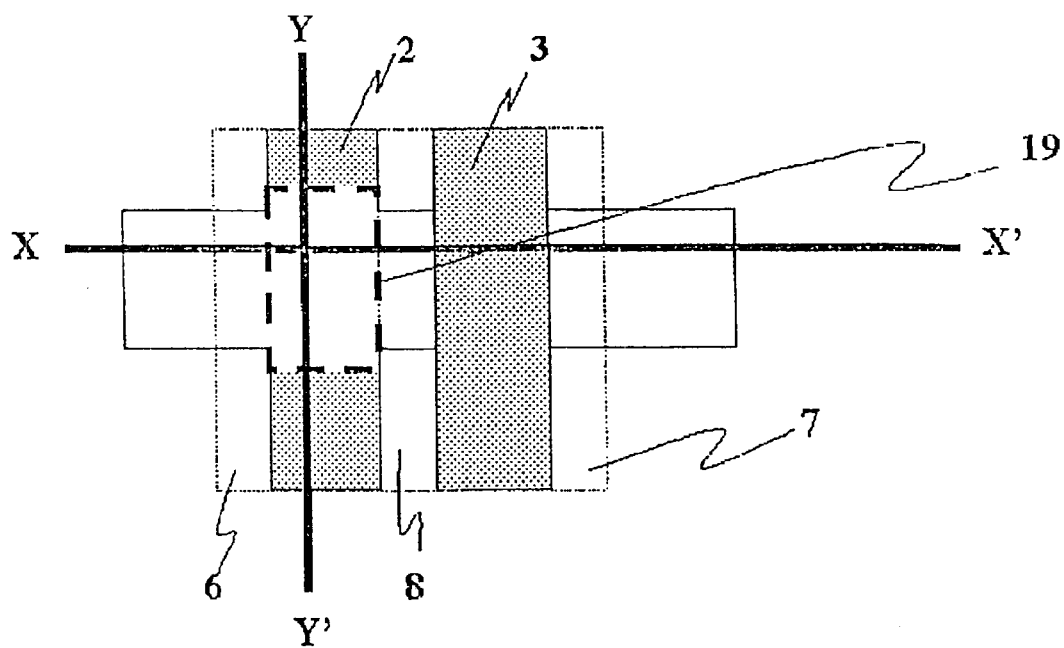
FIG. 4 is a plan view illustrating an embodiment of this invention.
Figure 5:
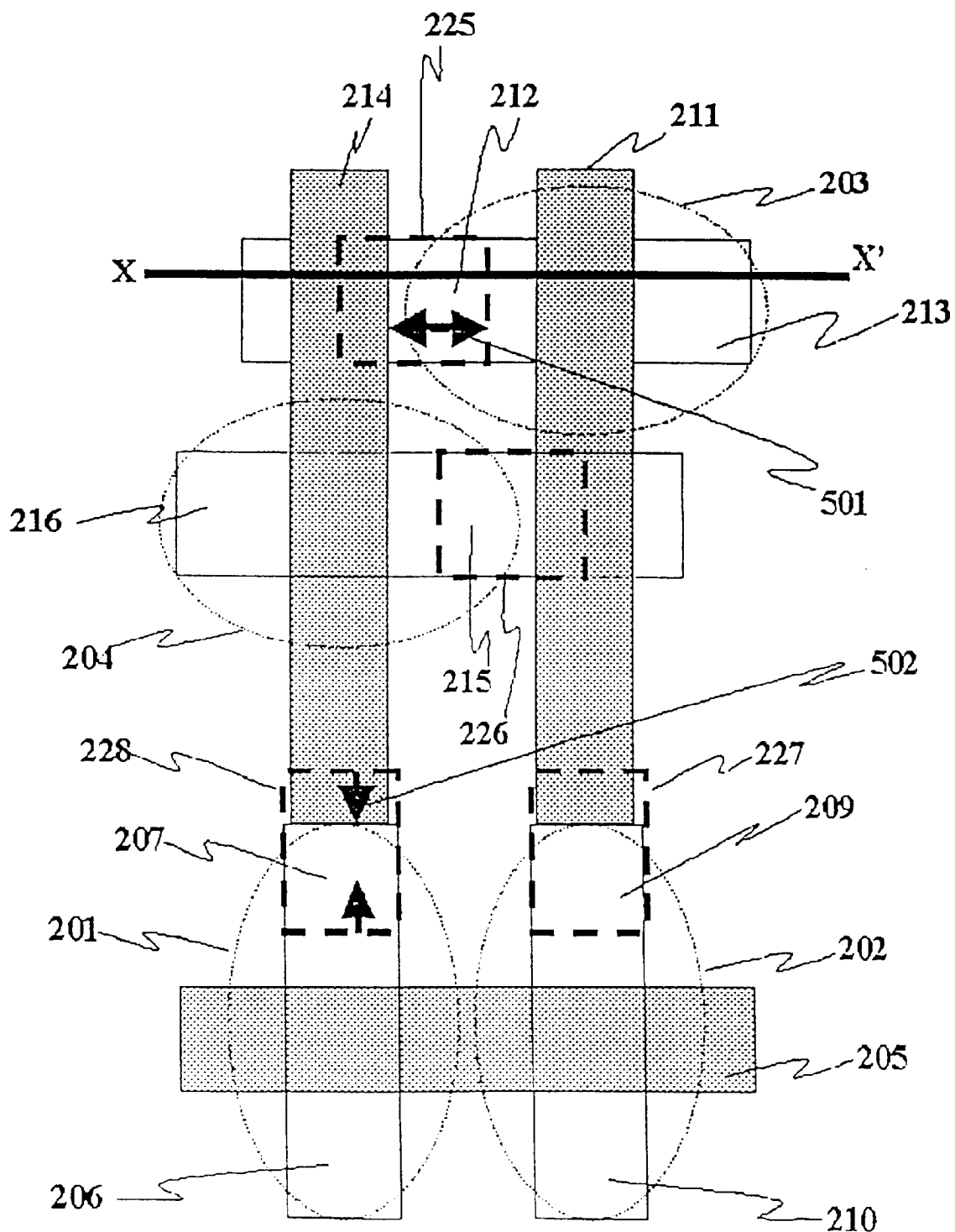
FIG. 5 is a plan view of a semiconductor device prepared according to the process of the prior art.

FIGS. 3 and 4 show a shape of the shared contact when adding the mask-superposing error. Both are plan views where the shared contact 425 in FIG. 1 is enlarged. A margin for the misalignment margin is included in the length in FIG. 3 and in the width in FIG. 4, in the gate length direction of the driver transistor.

Figure 2:
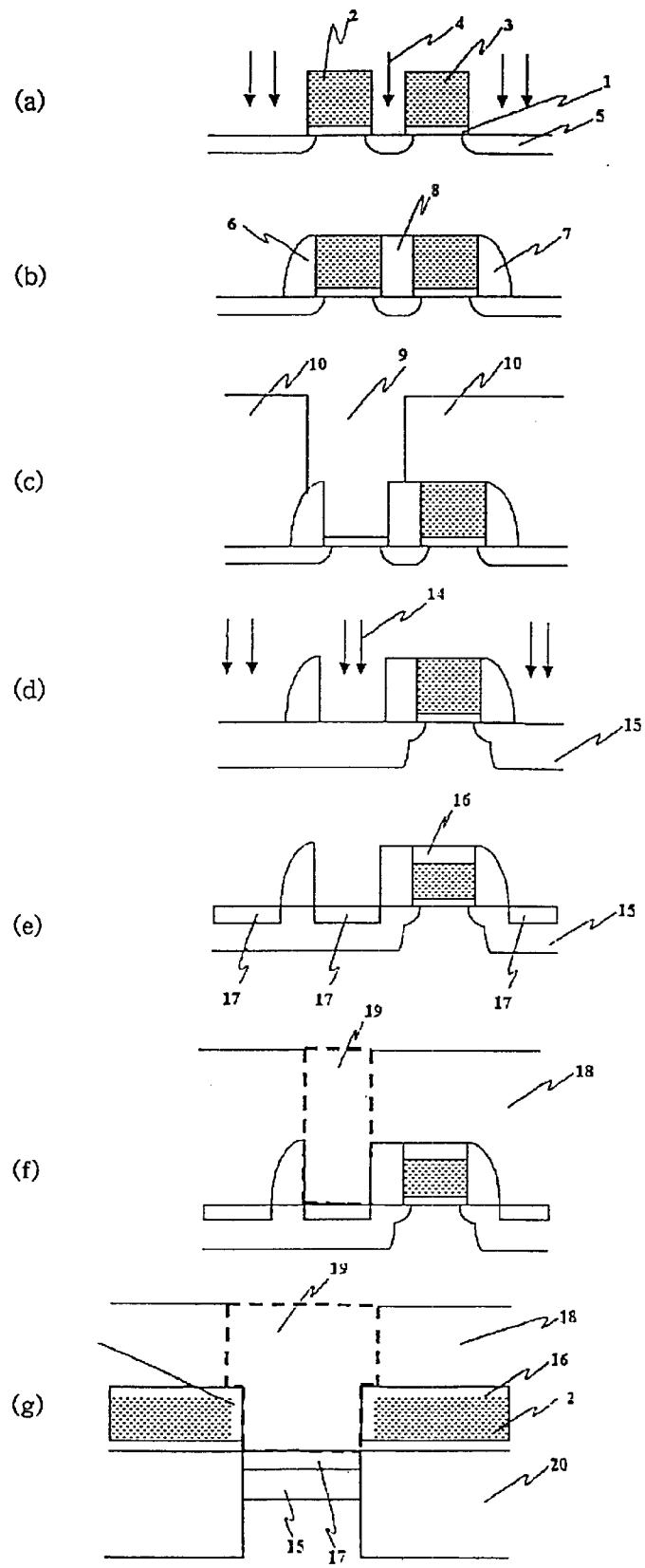
FIGS. 2(*a*) to 2(*g*) are cross sections sequentially showing manufacturing steps in an embodiment of this invention.

The same symbols as in FIG. 2 are used in FIGS. 3 and 4. In FIG. 3, 11 is a dopant diffusion layer.

Also in the example below, a margin for the misalignment margin is included in the gate width direction of the driver transistor.

This invention also provides a shared contact used in a semiconductor device with a flip-flop circuit or a semiconductor device where a gate electrode in one MOSFET is electrically connected to a source or drain region in another MOSFET, characterized in that the bottom surface of the shared contact is in contact with a dopant diffusion layer formed on the surface of the semiconductor surface , the side surfaces of the shared contact are in contact with cross sections of the gate electrode , and the substrate surface is electrically connected with the cross section of the gate electrode.

A process for manufacturing a shared contact according to this invention can be suitably used as one step in a manufacturing process for an SRAM.

A shared contact according to this invention can be suitably used as a component for an SRAM.

The example below relates to application of this invention to an SRAM, but besides an SRAM, this invention can be suitably applied a semiconductor device with a flip-flop circuit or a device comprising a circuit where a gate electrode in one MOSFET is electrically connected to a source or drain region in another MOSFET.

A conventional shared contact is formed protruding from a gate electrode. In an SRAM, reduction in a distance between gate electrodes is limited to a certain level, so that a cell size cannot be reduced. On the other hand, the process of this invention allows a shared contact without protrusion from a gate electrode to be prepared by removing an unnecessary gate electrode and forming a shared contact in the area. An SRAM prepared by applying this invention may have a smaller cell size than that according to the prior art.

EXAMPLE

FIG. 1 shows a plan view of a loadless type of four transistor SRAM cell prepared according to this invention.

Figure 6:
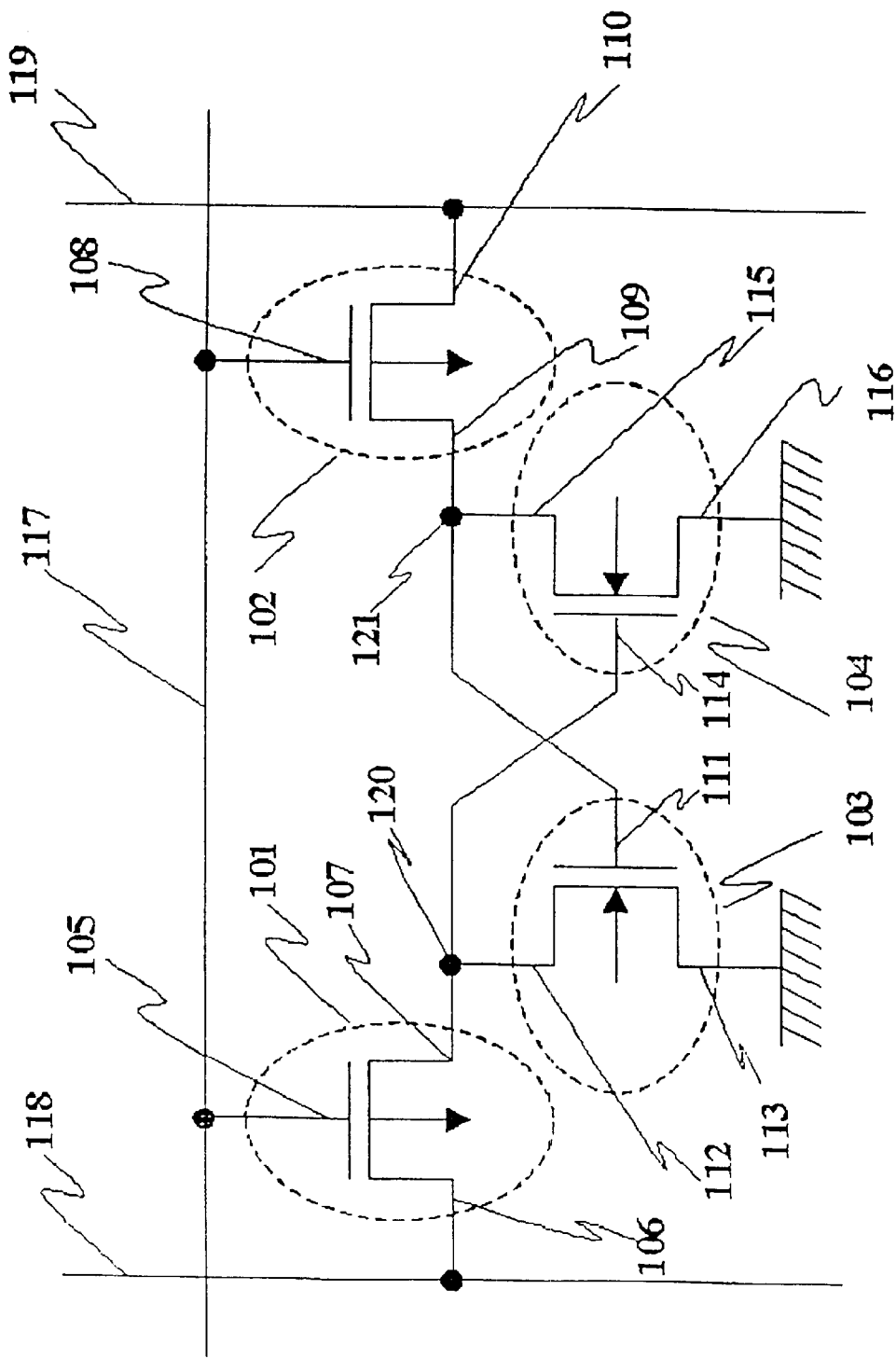
FIG. 6 is an equivalent circuit of a semiconductor device.

For constructing a loadless type of four transistor SRAM cell, a) a drain in the first access transistor, b) a drain in the first driver transistor and c) a gate in the second driver transistor are interconnected each other (120, 121 in FIG. 6). A shared contact is used to make this circuit in a semiconductor device on a substrate.

Figure 7:
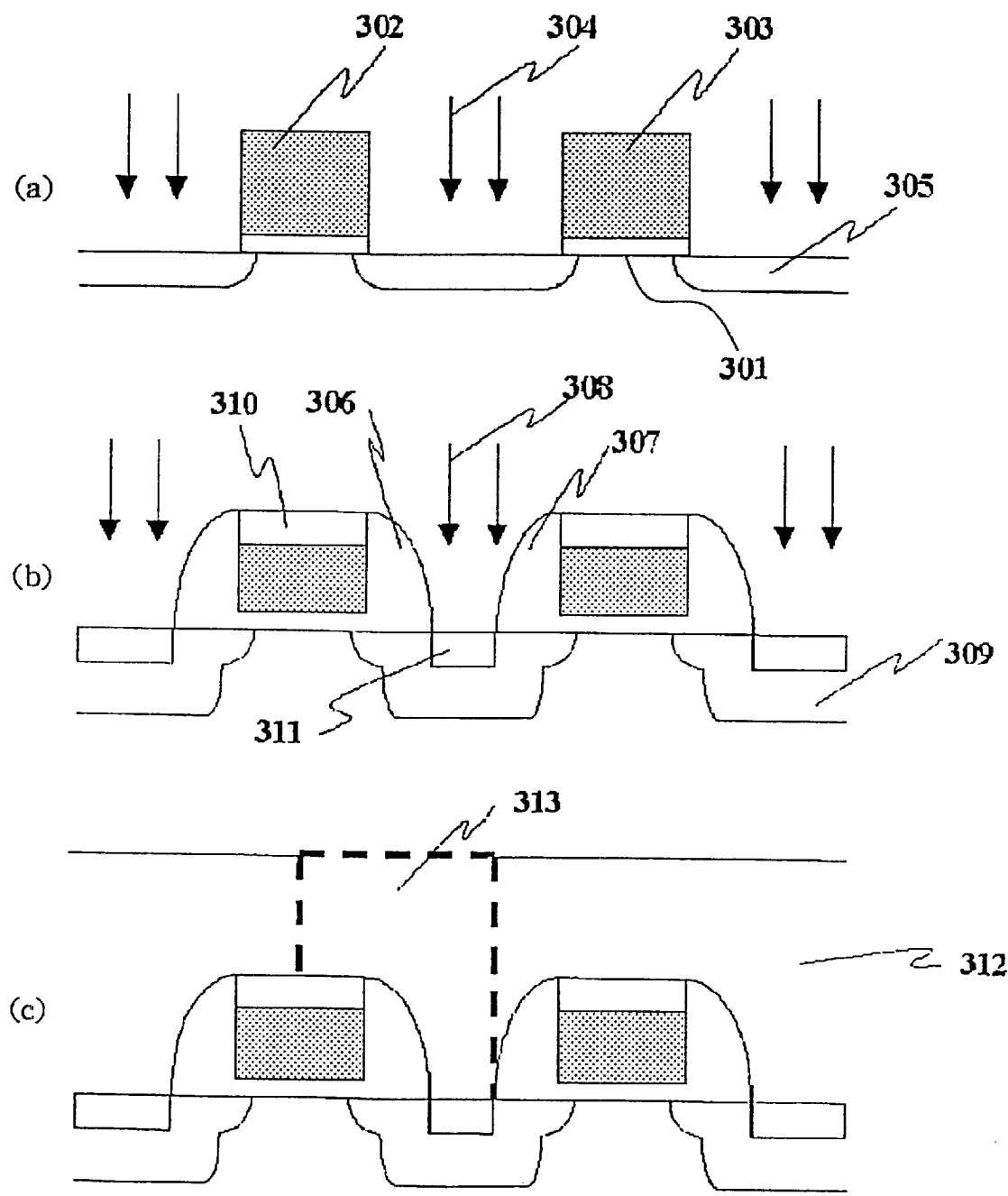
FIGS. 7(*a*) to 7(*c*) are cross sections showing an embodiment of the prior art.

A conventional shared contact is made of a conductive material as a bridge for connecting the surface of a gate electrode whose side is covered by a side wall to a drain on the substrate surface, i.e., it extends over the side wall for connecting them (313 in FIG. 7(c)). Adequate conductivity must be ensured between the gate and the drain which are interconnected with each other via a shared contact. Their contact regions (in both gate and drain sides) must have a certain contact area, which makes reduction in an SRAM cell size difficult.

This invention where the structure of the shared contact and the manufacturing process therefor are modified, can eliminate protrusion of the shared contact from the gate electrode and can reduce an SRAM cell size.

An example of this invention will be described mainly with reference to FIG. 1. FIG. 2 illustrating the steps with cross sections taken on line X-X' in FIG. 1 and FIG. 7 which is a cross section of a shared contact according to the prior art, will be used as necessary.

First, an oxide film (a field oxide film) for separating devices is formed on the surface of a substrate other than a region where a device is to be formed. Thus, a field oxide film for separating devices is formed on the substrate other than the source-drain regions of four transistors shown in FIG. 1.

Next, a step for forming a p-type well region is conducted. Specifically, it is formed by ion-implanting a p-type dopant using a photoresist having an opening in a predetermined area for preparing an n-type MOSFET represented by a driver transistor. For example, $B^+$ is implanted at an ion-implantation energy of 300 keV, a dose of $2\times10^{13}$ atoms/cm$^2$ and an implantation angle of 0°, then at an ion-implantation energy of 150 keV, a dose of $4\times10^{12}$ atoms/cm$^2$ and an implantation angle of 0° and finally at an ion-implantation energy of 30 keV, a dose of $8\times10^2$ atoms/cm$^2$ and an implantation angle of 0°.

Then, a step for forming an n-type well region is conducted. Specifically, it is formed by ion-implanting an n-type dopant using a photoresist having an opening in a predetermined area for preparing a p-type MOSFET represented by access transistors (401, 402). For example, $P^+$ is implanted at an ion-implantation energy of 500 keV, a dose of $2\times10^{13}$ atoms/cm$^2$ and an implantation angle of 0° then at an ion-implantation energy of 300 keV, a dose of $4\times10^{12}$ atoms/cm$^2$ and an implantation angle of 0° and finally at an ion-implantation energy of 130 keV, a dose of $6\times10^{12}$ atoms/cm$^2$ and an implantation angle of 0°.

To avoid complexity in the figure, the above device-separating oxide film, the p-type well region or an n-type well region is not shown.

On the p-type well region is formed two gate electrodes (411, 414) for a driver transistor in parallel.

This invention eliminate the necessity of forming a shared contact 313 (FIG. 7) between these gate electrodes, so that the distance between the gate electrodes (411, 414) is reduced compared with the prior art. The gate electrodes have a laminated structure consisting of a gate oxide film and polysilicon. The gate oxide film (1 in FIG. 2(a)) is deposited to about 4 nm by an appropriate procedure such as thermal oxidation. On the gate oxide film is further deposited polysilicon to about 160 nm. Finally, the product is subject to photolithography and etching to provide a gate electrode (2, 3 in FIG. 2(a)).

For ensuring conduction between the driver transistor and the access transistor, two gate electrodes for a driver transistor described above is formed such that one end is overlay on a drain-forming region (407, 409) in the access transistor (401, 402) on the n-type well region for facilitating conduction between the access transistor and the gate electrodes in a subsequent step.

While forming the gate electrodes (411, 414) for the driver transistor, one gate electrode (405) for an access transistor perpendicular to two gate electrodes (411, 414) is formed on the n-type well region.

After the step, an LDD region is formed on each of the driver transistor and the access transistor. In the driver transistor is implanted an n-type dopant such as $As^+$ (4 in FIG. 2(a)). The ion-implantation conditions herein are as follows: an implantation energy of 10 keV, a dose of $1\times10^{14}$ atoms/cm$^2$, and an implantation angle of 0°. In the access transistor is implanted an p-type dopant such as $BF_2^+$(not shown). The ion-implantation conditions herein are as follows: an implantation energy of 5 keV, a dose of $6\times10^{13}$ atoms/cm$^2$, and an implantation angle of 0°

Then, on the whole surface of the substrate is deposited an oxide film with a thickness of about 120 nm by, for example, LPCVD for forming a side wall consisting of a silicon oxide film. Then, the whole surface of the substrate is etched back by, for example, RIE to form a side wall covering the side of the gate electrode with a width of 100 nm (6, 7, 8 in FIG. 2(b)).

The side wall consisting of an insulating material may be preferably a silicon oxide, silicon nitride or nitride oxide silicon film.

One of the differences between this invention and the prior art is that in this invention, the distance between the gate electrodes in the driver transistor is reduced and thus the side walls 8 between the gate electrodes are in contact with each other (FIG. 2(b)), but it does not affect the structure of the SRAM cell.

After forming the side wall, the gate electrode in the area where a shared contact is to be formed (425 to 428) is removed for forming a shared contact. It is formed by applying a photoresist over the whole surface of the substrate by usual photolithography, exposing and developing the surface, and finally etching the gate electrode in the area where a shared contact is to be formed by RIE using the photoresist (10 in FIG. 2(c)) as a mask. FIG. 2(c) shows a cross section taken on line X-X' after completion of the step. In RIE, an etching selection ratio can be adjusted to about 70 between polysilicon as a gate electrode material and $SiO_2$ as a side wall material. The gate electrode can be, therefore, selectively removed to form a hole 9.

As described above, gate electrodes are removed in shared contact forming regions in 426 to 428.

After the step, on the driver transistor are formed $n^+$type of source regions (413, 416) and drain regions (412, 415).

During the procedure, a dopant is also implanted in the shared contact forming areas where the gate electrode has been removed during the previous step, and the shared contact forming areas (425, 426) are individually connected to the drain regions (412, 415) via an n-type dopant layer (FIG. 2(*d*)). The dopant is introduced by ion implantation. For example, in the driver transistors (403, 404), a source-drain region (15 in FIG. 2(*d*)) is formed by implanting As$^+$ions as an n-type dopant (14 in FIG. 2(*d*)) at an implantation energy of 45 keV, a dose of 5×10$^{15}$ atoms/cm$^2$ and an implanting angle of 0°

As described for the driver transistor, p$^+$type of source regions (406, 410) and drain regions (407, 409) are formed in the access transistor. B$^+$as a p-type dopant is implanted at an implantation energy of 5 keV, a dose of 5×10$^{15}$ atoms/cm$^2$ and an implanting angle of 0°, during which the dopant is also implanted to the surfaces where the gate electrode has been removed (the areas of 427, 428).

Then, silicide layers (16, 17 in FIG. 2(*e*)) are formed in the source-drain region and the gate electrode region They are formed, for example, by depositing cobalt to about 100 Å by spattering and then heating and wet-etching the surface (FIG. 2(*e*)).

Then, an interlayer insulating film (18 in FIG. 2(*f*)) is deposited on the whole surface of the substrate and the area where a shared contact is to be formed is etched to form a contact hole. In this example, when forming the contact hole, a misalignment margin generated in the subsequent photolithography step is added to the length in the gate width direction of the driver transistor.

Then, a shared contact 19 is formed by filling the contact hole with, e.g., tungsten by a known technique (FIG. 2(*f*)). FIG. 2(*g*) shows a cross section of the shared contact thus prepared taken on line Y-Y'.

As seen in FIGS. 2(*f*) and (*g*), the shared contact of this invention is in contact with the source-drain region (17 in FIG. 2(*g*)) in its bottom while with the gate electrode (2 in FIG. 2(*g*)) in its side.

Here, 20 in FIG. 2(*g*) is a device-separating insulating layer. The other shared contacts 426 to 428 are also formed as described above.

In the light of the fact that in the prior art a shared contact connects a gate surface with a source-drain region surface like a bridge, it is apparent that this invention effectively utilizes a limited space in the cell region. Reduced areas according to this invention are shown in FIG. 1 which is a schematic view of an SRAM according to the prior art (501, 502).

Then, interconnections are formed by a known technique to provide an SRAM cell.

As described above, according to this invention, the size of the SRAM cell can be reduced by 180 nm in the horizontal direction in FIG. 1 and by 100 nm in the vertical direction in FIG. 1 for this interconnection width.

What is claimed is:

1. A process for manufacturing a shared contact in a semiconductor device with a flip-flop circuit or a semiconductor device where a gate electrode in a first MOSFET is electrically connected to a source or drain region in a second MOSFET, essentially consisting of the steps of:

1) forming a gate electrode in a first MOSFET and a second MOSFET on a semiconductor substrate surface;

2) depositing an insulating material on the whole surface of the semiconductor substrate surface and etching a first part of said insulating material back to form a side wall made of the insulating material on the side of the gate electrode;

3) removing a first part of the gate electrode for exposing a corresponding part of the semiconductor substrate surface;

4) ion-implanting a dopant whose conduction type is different from that in the semiconductor substrate, to the exposed semiconductor substrate surface in the area where the first part of the gate electrode has been removed and ion-implanting said dopant to a source-drain region of said first MOSFET and said second MOSFET;

5) depositing an interlayer insulating film on the whole surface of the semiconductor substrate surface and removing the interlayer insulating film in the area where the first part of the gate electrode has been removed to form a contact hole; and 6) filling a conductive material in the contact hole.

2. The process for manufacturing a shared contact as claimed in claim 1 where the side wall made of an insulating material is selected from the group of a silicon oxide, a silicon nitride and a nitride oxide silicon films.

3. The process for manufacturing a shared contact as claimed in claim 1 where in the above step 5), a misalignment margin in a photolithography process is added to the perimeter of the contact-hole during said forming of the contact hole in the direction of a gate width and/or a gate length of said gate electrode formed in said first MOSFET and said second MOSFET.

4. A process for manufacturing an SRAM comprising, as one step, the process for manufacturing a shared contact as claimed in claim 1.

* * * * *